United States Patent [19]

Bay et al.

[11] Patent Number: 5,020,476

[45] Date of Patent: Jun. 4, 1991

[54] DISTRIBUTED SOURCE ASSEMBLY

[75] Inventors: Steven T. Bay, San Jose; Dan Prince, Irvine, both of Calif.

[73] Assignee: DS Research, Inc., San Jose, Calif.

[21] Appl. No.: 509,750

[22] Filed: Apr. 17, 1990

[51] Int. Cl.$^5$ ............................................. C23C 16/00
[52] U.S. Cl. ................................. 118/728; 118/715; 118/725; 118/500
[58] Field of Search ................ 118/715, 725, 728, 500

[56] References Cited

U.S. PATENT DOCUMENTS

| 4,573,431 | 3/1986 | Sarkozy | 118/725 |
| 4,593,644 | 6/1986 | Hanak | 118/725 |
| 4,911,638 | 3/1990 | Bayne | 118/725 |

FOREIGN PATENT DOCUMENTS 61-164224 7/1986 Japan .

Primary Examiner—Richard Bueker
Attorney, Agent, or Firm—Hugh D. Jaeger

[57] ABSTRACT

Apparatus of quartz or silicon carbide for use in horizontal or vertical furnace tubes, applicable to both diffusion/oxidation processes and to low pressure chemical vapor deposition process. The primary objectives include the adjustment of process gas flow distribution to improve film growth and composition uniformity to increase film growth rate and to reduce the consumption of reactant gases.

The apparatus consists of four major types of components, namely a plurality of substrate carriers or boats, a plurality of gas distribution discs, front and rear manifold link fixtures and primary and secondary gas injection tubes. Substrate carriers or boats are constructed of quartz or silicon carbide or other chemically nonreactive, thermally resistant materials which support a plurality of substrates on edge in machined slots in the substrate carriers interiorly along the length of a furnace tube. The substrates rest perpendicular to the longitudinal axis of the furnace tube. The substrate carriers, the front and rear manifold link fixtures, the gas distribution discs, and primary and secondary gas injection tubes and their associated components are supported on a cantilevered paddle for longitudinal movement within the furnace tube.

20 Claims, 11 Drawing Sheets

DISTRIBUTED SOURCE ASSEMBLY

CROSS REFERENCES TO CO-PENDING APPLICATIONS

None.

BACKGROUND OF THE INVENTION

1. Field of the Invention

Semiconductor diffusion/oxidation processing and low pressure CVD of silicon dioxide (doped and undoped), silicon (doped and undoped), single- and polycrystalline, silicon nitride, and other thin films (conductive, semiconductive, and insulating) on semiconductor wafer substrates. Low pressure CVD of silicon dioxide (doped and undoped), polysilicon (doped and undoped), silicon nitride, and other thin films (conductive, semiconductive, and insulating) or larger for display panel substrates.

2. Description of the Prior Art

Chemical vapor deposition in existing furnace-tube CVD technology is based on a fundamental misunderstanding of the physical and chemical processes which occur in the reaction chamber. In Hochberg and in Zaferes, it is claimed that the cage structure creates a "turbulence" in the flow of reactant gas to achieve improved film uniformity, while in McMullen and in Dozier, it is claimed that the cage structure causes the gases to be "directed" around the substrates to achieve film uniformity. In fact, the cage provides a "depletion surface" which consumes most of the reactant before it can reach the substrates. This increases the mean free path of the reactant which increases film deposition uniformity and decreases film growth rate.

Two companies, the Thermco Division of Silicon Valley Group and BTU Engineering, dominate the furnace tube CVD process market at this time. They are continuing to try to push the performance of their existing designs beyond practical limits.

The diffusion/oxidation technology marketed by competitors is decades old. No significant research has been pursued in this field for a very long time. Rapid Thermal (single-wafer) processes are being developed, but there are significant technical and throughput hurdles to be overcome.

In CVD, additional non-furnace CVD suppliers are Novellus Systems and Applied Materials. These two companies market high-end, very expensive (>$700,000) systems for silicon dioxide (LTO, PSG & BPSG) and passivation silicon nitride deposition. In spite of their very high price tags, the Novellus and Applied Materials technologies have developed considerable momentum in the marketplace. The source of this momentum lies in the failure of the furnace vendors to develop adequate process technology for their systems. Clearly, a furnace-based process which produces films of equal quality at one-third the capital cost would be far more economically attractive. Equal quality means equal physical/electrical performance (film thickness & compositional uniformity), equal process yield (particulate density and process-related device damage), and equal throughput. Currently available equipment has difficulty achieving within-wafer and wafer-to-wafer process uniformity better than ±10%. The primary problem with this process being too much doping at the wafer edge and not enough at wafer center. Existing systems are run with one-half to one-quarter size loads to improve batch yields. Process throughput suffers accordingly, and the result is a poor return on the investment in process hardware. The present invention hardware design will make possible doping and thickness uniformity of better than ±2% on full loads and on all wafer sizes from three inch to eight inch.

The present invention is a unique process hardware configuration for installation in existing or new horizontal or vertical furnace systems.

The present invention addresses a major weakness in existing furnace-based process hardware design. Currently available hardware does not "scale" easily to increases in wafer diameter. As size increases it becomes expotentially more difficult to adapt existing process technology to achieve previous standards of film quality. To make matters worse, film quality standards become more stringent each year. Existing systems produce acceptable results on three-, four- and five-inch wafers, but six-inch and larger wafers have proven to be a formidable obstacle. Delays in overcoming this obstacle have led to the success of Novellus Systems and Applied Materials in the single-wafer type PECVD systems. The new PECVD systems have one serious weakness, and that is expense. At three-quarters of a million dollars each, they are almost ten times the cost of existing furnace-based systems.

The present invention is developing the technology that will make available low-cost alternatives to the new systems while maintaining high standards of process quality. The equipment will be easier to automate than existing furnace-based systems and will adapt easily to the new vertical furnaces. It will consume less process gas than existing systems and will also generate less process-related particulate. This means that it will be able to run longer between clean cycles, and this, coupled with higher film growth rates, will result in more wafers being processed in less time (higher throughput). Most importantly, film thickness uniformity on large diameter wafers will be comparable to that achieved in the new single-wafer machines at a fraction of the capital cost.

SUMMARY OF THE INVENTION

The general purpose of the present invention is based on the concept that the only goal of gas distribution is to provide a uniform amount of reactant to all points on the substrate surface at all times during the process. This is accomplished through the use of gas distribution discs positioned between the faces of back-to-back substrates. Reactant is supplied to the distribution discs by an arrangement of gas injector tubes built into the body of the substrate carriers. Process gas flows are adjusted to limit the amount of excess reactant which, in turn, limits the amount of "spill-over" deposition on substrates closer to the system exhaust, and the amount of deposition on furnace tube or tube liner surfaces making for a more uniform and much cleaner CVD process.

The same process hardware design is applicable to diffusion/oxidation processes. It is possible to duplicate the effect of disc-type solid dopant sources placed between substrates in the reaction chamber by delivering gaseous or vapor sources by way of gas distribution discs.

For very large substrates, existing doping and CVD processes do not scale easily to larger substrates (i.e., six, eight, ten and twelve inch semiconductor wafers, large glass display substrates, etc.). The proposed invention is not sensitive to changes in substrate size, therefore process development is simplified and previously impractical processes can be made practical.

According to one embodiment of the present invention, there is provided an apparatus for producing thin film coatings and/or dopant levels on or in semiconductor wafers or other substrates with improved film growth uniformity (of thickness and composition) and/or dopant uniformity, the substrates and the boats comprising a set of rails slotted for the support of substrates to be processed at desired spacings, and also slotted for the support of gas distribution discs between successive sets of back-to-back substrates; a primary injection tube running the length of the boat having ball joint fittings at each end for mating with other boats or manifold link fixtures and linked by small tubes to a secondary injection tube; a secondary injection tube running the length of the boat having ball joint fittings at each end for mating with other boats or manifold link fixtures and slotted and recessed at intervals to coincide with the positions of gas distribution discs; gas distribution discs or plates resting on the recesses cut into the secondary injector, facing the substrates, fed by the slots cut into the secondary injector, and having a number of small openings in both faces for the uniform distribution of process gases or vapors to the surfaces of the substrates.

Significant advantages and features of the present invention include high uniformity processing in semiconductor doping; high uniformity (thickness and composition) in CVD; insensitivity to substrate size; reduced processing time (higher process rates); shortened process development cycle (lower startup costs); greatly improved process cleanliness (higher yield) reduced gas flows (conservation of expensive reactant); and compatibility with existing processing equipment (lower capital cost).

Having thus described the embodiments of the present invention, it is a principal object hereof to provide a process technology applicable to low-pressure CVD of semiconductor thin films and high uniformity diffusion/oxidation processes. This technology also has applications outside the semiconductor device market.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DESCRIPTION OF THE PREFERRED EMBODIMENTS

Figure 1:
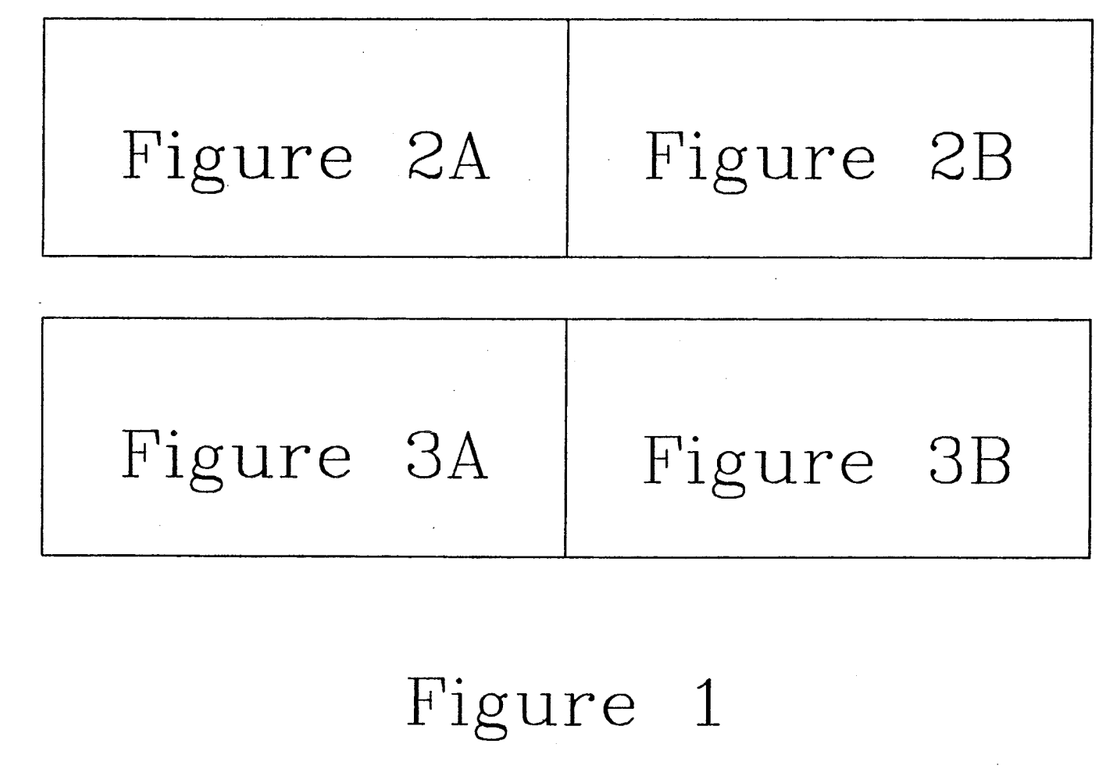
FIG. 1 illustrates the orientation of FIGS. 2A-2B and FIGS. 3A-3B.

FIG. 1 illustrates the orientation of FIGS. 2A-2B and FIGS. 3A-3B.

Figure 2A:
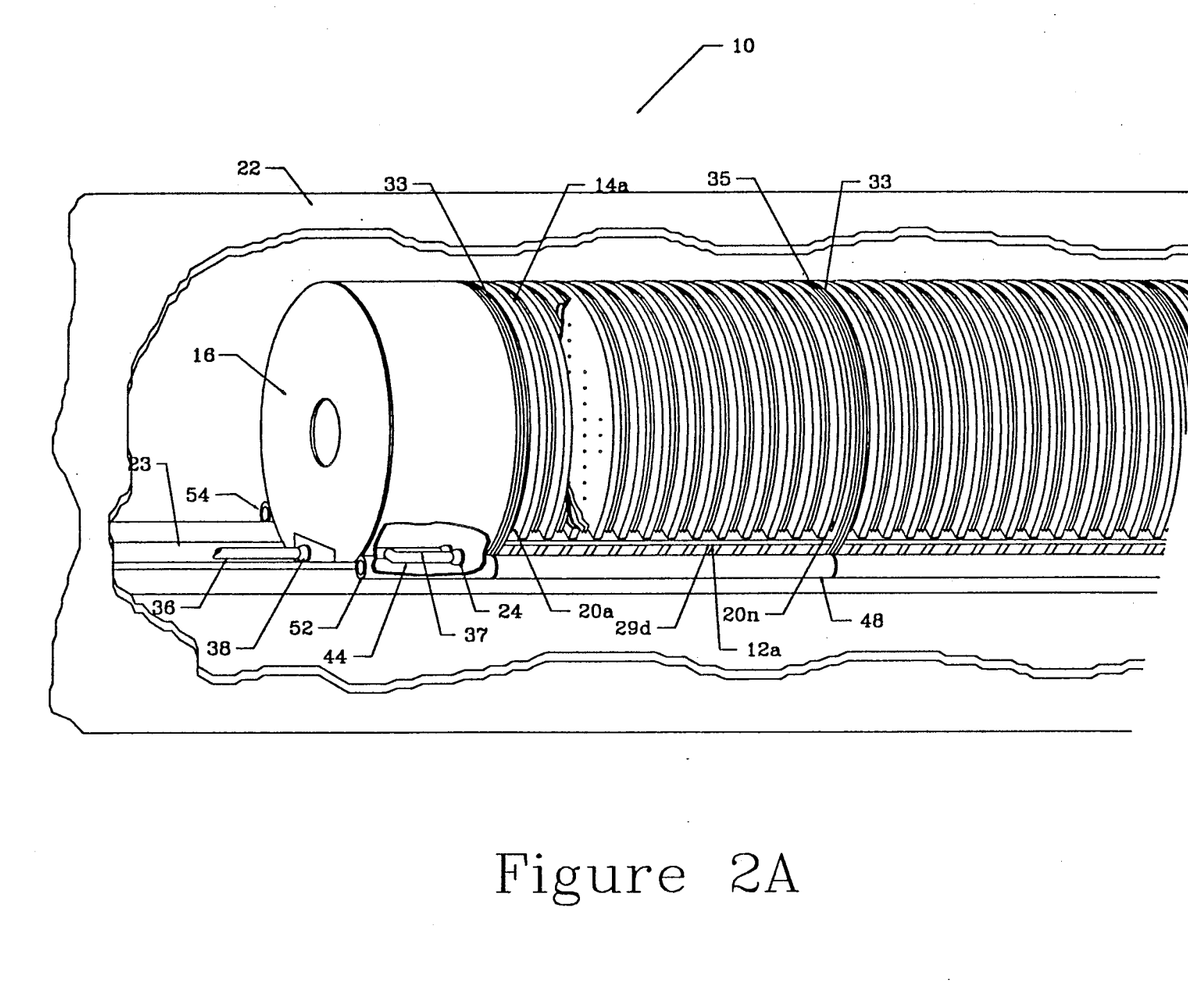
FIGS. 2A-2B illustrate a loaded distributed source assembly in a cutaway perspective view.
Figure 2B:
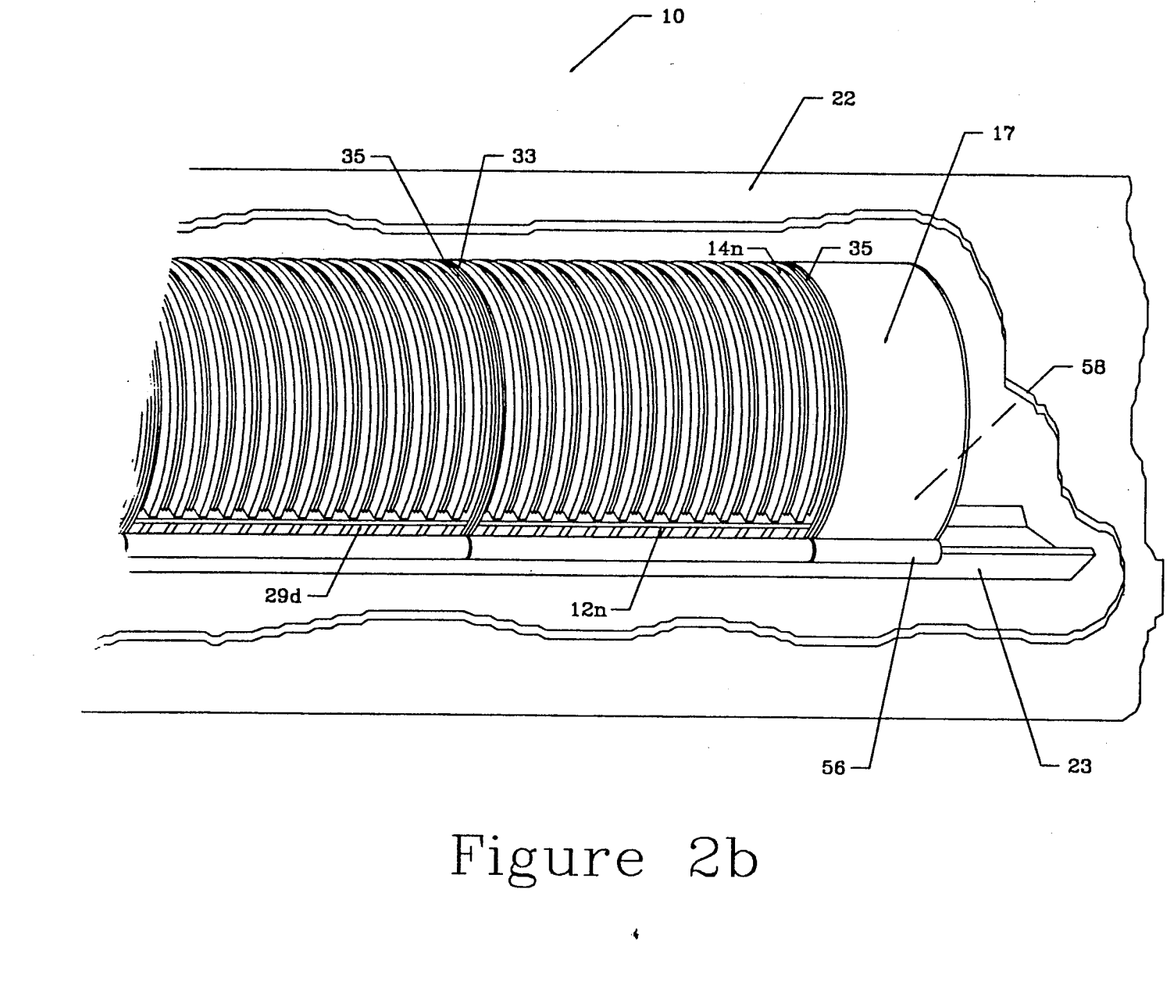
Figure 3A:
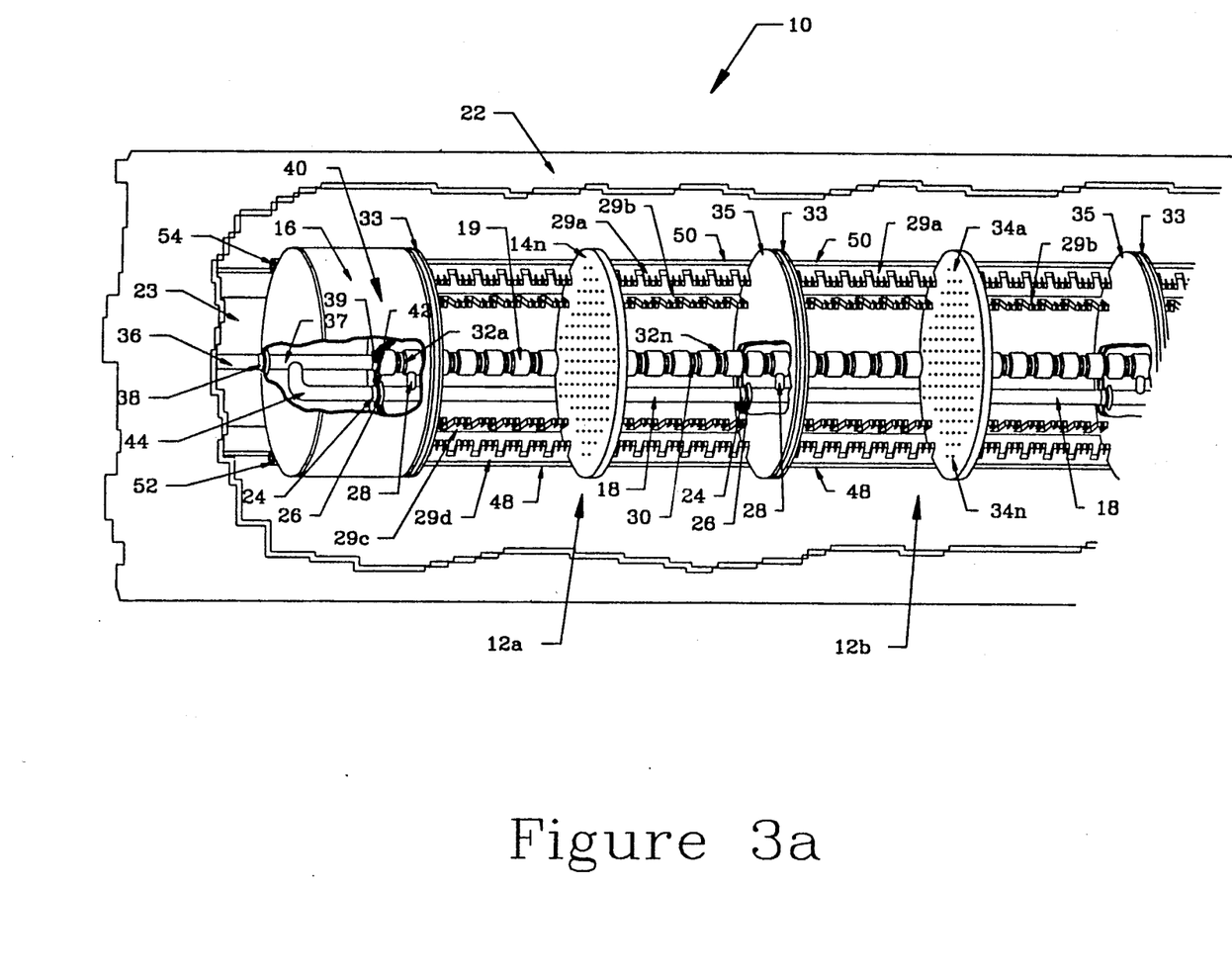
FIGS. 3A-3B illustrate a distributed source assembly in a cutaway perspective view.
Figure 3B:
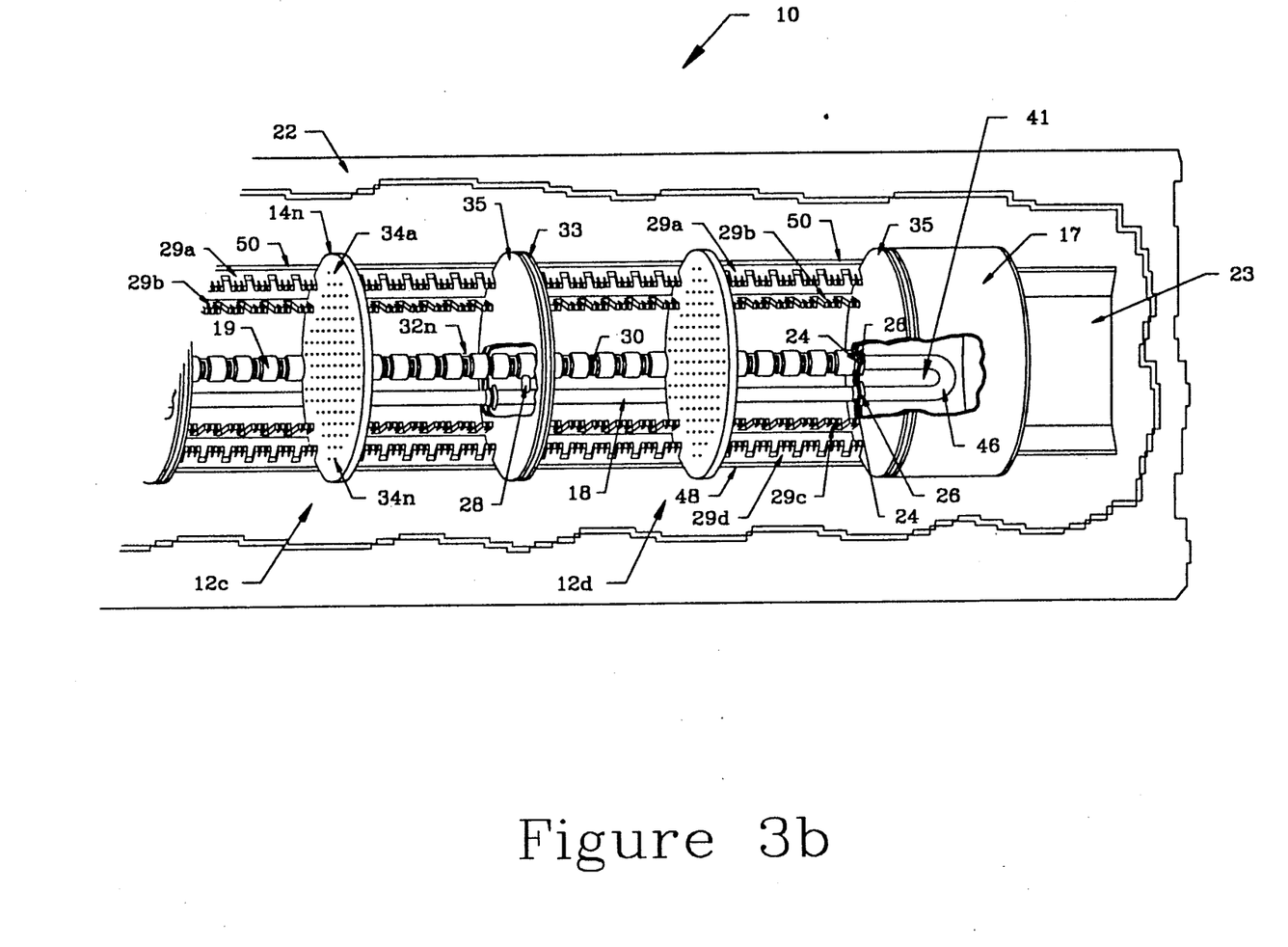

FIGS. 2A-2B and 3A-3B illustrates a distributed source assembly 10, the present invention, in cutaway perspective view. FIGS. 2A-2B illustrates the distributed source assembly 10 loaded with a full complement of gas distribution discs and substrates. FIG. 3A-3B illustrates the distributed source assembly 10 with only a small number of gas distribution discs in position so that the substrate carriers or boats and gas injection tubes may be viewed.

The distributed source assembly 10 consists of four major types of components, namely a plurality of substrate carriers or boats 12a-12n, a plurality of gas distribution discs 14a-14n, front and rear manifold link fixtures 16 and 17, and primary and secondary gas injection tubes 18 and 19. Substrate carriers or boats 12a-12n are constructed of quartz or silicon carbide or other chemically nonreactive, thermally resistant materials which support a plurality of substrates 20a-20n on edge in machined slots in the substrate carriers 12a-12n interiorly along the length of a furnace tube 22. The substrates 20a-20n rest perpendicular to the longitudinal axis of the furnace tube 22. The substrate carriers 12a-12n, the front and rear manifold link fixtures 16 and 17, the gas distribution discs 14a-14n and primary and secondary gas injection tubes 18 and 19 and their associated components are supported on a cantilevered paddle 23 for longitudinal movement within the furnace tube 22. The substrates 20a-20n are loaded into the substrate carriers 12a-12n in pairs, back-to-back, in close proximity. The underside of each of the substrate carriers 12a-12n house both a primary gas injection tube 18 and a secondary gas injection tube 19, running along the entire length of each of the substrates carriers 12a-12n. Both injection tubes 18 and 19 are open at each end of a substrate carrier, such as substrate carrier 12a, and have male ball joint fittings 24 at one end and female ball joint fittings 26 at the other. Ball joint fittings 24 and 26 are used throughout the invention. The primary gas injection tube 18 feeds the secondary gas injection tube 19 via one or more crosslinks 28 positioned along the length of each of the substrate carriers 12a-12n. The secondary gas injection tube 19 has slotted openings 30 distributed along the length of the secondary gas injection tube 19. The gas distribution discs 14a-14n rest in shallow annular recesses 32a-32n in the secondary gas injection tube 19 directly over the slotted openings 30 and between each pair of face-to-face substrates 20a-20n. A segment of the circumference of each gas distribution disc 14a-14n is machined to match the outside diameter of the secondary gas injection tube 19, as later described in detail. Both planar faces of each gas distribution disc 14a-14n have a number of small openings 34a-34n arranged in a regular pattern conducive to a uniform distribution of process gases to the substrate surface.

Each boat or substrate carrier 12a-12n includes opposing end plates 33 and 35 at the ends of each substrate carrier 12a-12n. Tubes 48 and 50 align and secure along the lower regions of each of the substrate carriers 12a-12n. The front manifold link fixture 16 and the rear manifold link fixture 17 include tubes 52 and 54, and 56 and 58, respectively, which align with and are similar to the tubes 48 and 50 along the lower extremities of the substrate carriers 12a-12n. A plurality of slotted rails including rails 29a-29d align longitudinally between end plates 33 and 35 in each of the substrate carriers 12a-12n for accommodation of the gas distribution discs 14a-14n and the substrates 20a-20n in different arrangements of slots. The slot arrangement is described in detail in FIGS. 4, 5, and 6.

At each opposing extreme end of a set of substrate carriers 12a-12n are special boat-like manifold link fixtures 16 and 17 which complete the gas inject loop between the primary and secondary gas injection tubes 18 and 19. The purpose in linking the primary and secondary injection tubes 18 and 19 at the front manifold link fixture 16 and at the rear manifold link fixture 17 of a set of boats and at crosslink points 28 within each boat, is to balance the gas pressure along the entire length of the composite secondary gas injection tube 19. This makes it possible to deliver the same amount of gas flow to each gas distribution disc 14a-14n, and achieve excellent uniformity of film thickness and composition across the entire batch of substrates 20a-20n.

Figure 4:
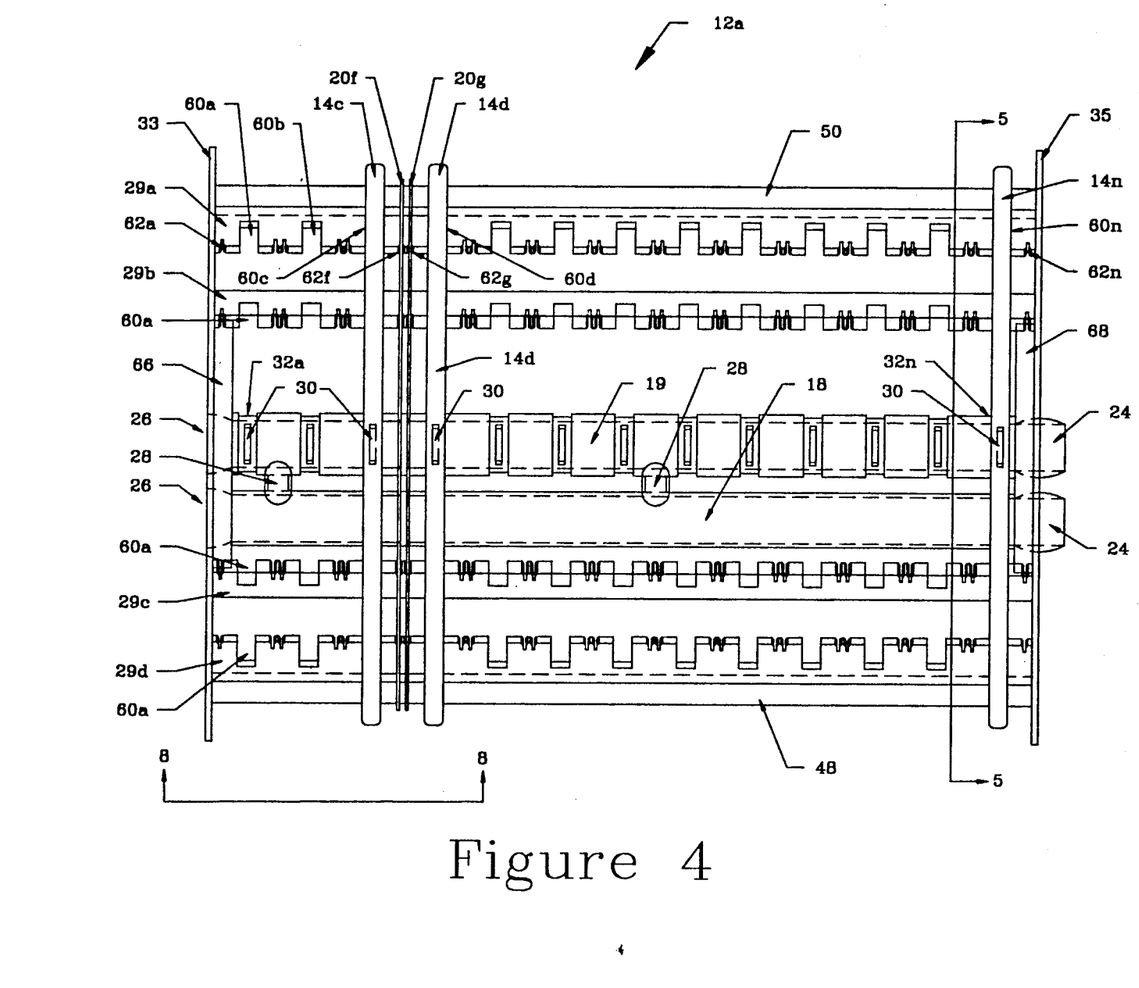
FIG. 4 illustrates a top view of a substrate carrier.

Substrates 20a-20n are loaded manually or by some form of automated apparatus into the slots provided in the substrate carriers which are illustrated in FIG. 4. The substrate carriers 12a-12n are loaded into the furnace loading apparatus, typically a form of a cantilever paddle 23, and mated to one another in a series at their respective ball joint fittings 24 and 26. The front and rear manifold link fixtures 16 and 17 are mated at each end of the set of substrate carriers 12a-12n to complete the process gas inject loop. The process gas tube source 36 is mated to a fitting 38 on the front manifold link fixture 16. Tube 37 extends inwardly from the fitting 38 and connects with the secondary gas injection tube 19 through a male ball joint fitting 39 and a female ball joint fitting 42. An angled tube 44 connects between the tube 37 and the primary gas injection tube 18 via the ball joint fittings 24 and 26. The far opposing ends of the primary and secondary gas injection tubes 18 and 19 are connected by a U-shaped tube 46 through intermediary male and female ball joint fittings 24 and 26.

When the cantilever paddle 23 and the distributed source assembly 10, with the substrate carriers 12a-12n, has been loaded into a furnace, and the process temperature has stabilized, the process gas is turned on and pressurizes both the primary and secondary gas injection tubes 18 and 19. As gas is drained from the secondary gas injection tube 19 by the gas distribution discs 14a-14n, it is replaced by gas from the primary gas injection tube 18 through the crosslinks 28 along its length, and at both ends 40 and 41 by the front and rear manifold link fixtures 16 and 17. In this way, all gas distribution discs 14a-14n receive an identical source pressure of reactant gas. The gas flows into the gas distribution discs 14a-14n and fills them uniformly. Uniform filling is accomplished by using a minimum internal volume for each disc. For example, when processing 125 millimeter semiconductor wafers, each disc will have an internal volume of less than two cubic centimeters. The gas passes uniformly out of openings on both faces of the distribution discs, and is uniformly distributed across the surface of the substrates.

Small amounts of unreacted gas are exhausted at the source end of the reaction chamber either by a differential pressure exhaust in the case of atmospheric processes, or by a vacuum pump in the case of low pressure processes.

On completion of the desired amount of film growth, the cantilever with boats and substrates is withdrawn from the furnace tube and the substrates are removed to the next process step.

FIG. 4 illustrates a top view of a substrate carrier 12a where all numerals correspond to those elements previously described. Each of the similar slotted rails 29a-29d include a plurality of wide slots 60a-60n mutually aligned laterally across the distributed source assembly 10 for frictional engagement and accommodation of the gas distribution discs 14a-14n. Narrow slots 62a-62n in the slotted rails 29a-29d accommodate the substrates 20a-20n in vertical alignment. The substrates 20f and 20g are placed back-to-back in a pair of adjacent narrow slots 62f-62g and align between the gas distribution discs 14c and 14d which are engaged in wide slots 60c and 60d, respectively. Wide annular grooves 64 are spaced along the secondary gas injection tube and align laterally with the wide slots 60a-60n in the slotted rails 29a-29d across the distributed source assembly 10. The aligned wide slots, such as 60a, in each of the rails 29a-29d and corresponding annular groove 64 in the secondary gas injection tube 19 align to accommodate a gas distribution disc as additionally illustrated with reference to the gas distribution disc 14c of this Figure. Slotted opening 30 aligns with a notch in the circumference of each of the gas distribution discs 14a-14n to supply gas supplied by the secondary gas injection tube 19 to the interior of the gas distribution disc system as later described. Gas is subsequently passed from the gas distribution discs directly to the adjacent substrates. Plates 66 and 68 secure inwardly and adjacent to the end plates 33 and 35, respectively. The plates 66 and 68 assist in fastening and securement of the primary and secondary gas injection tubes 18 and 19 between the end plates 33 and 35.

Figure 5:
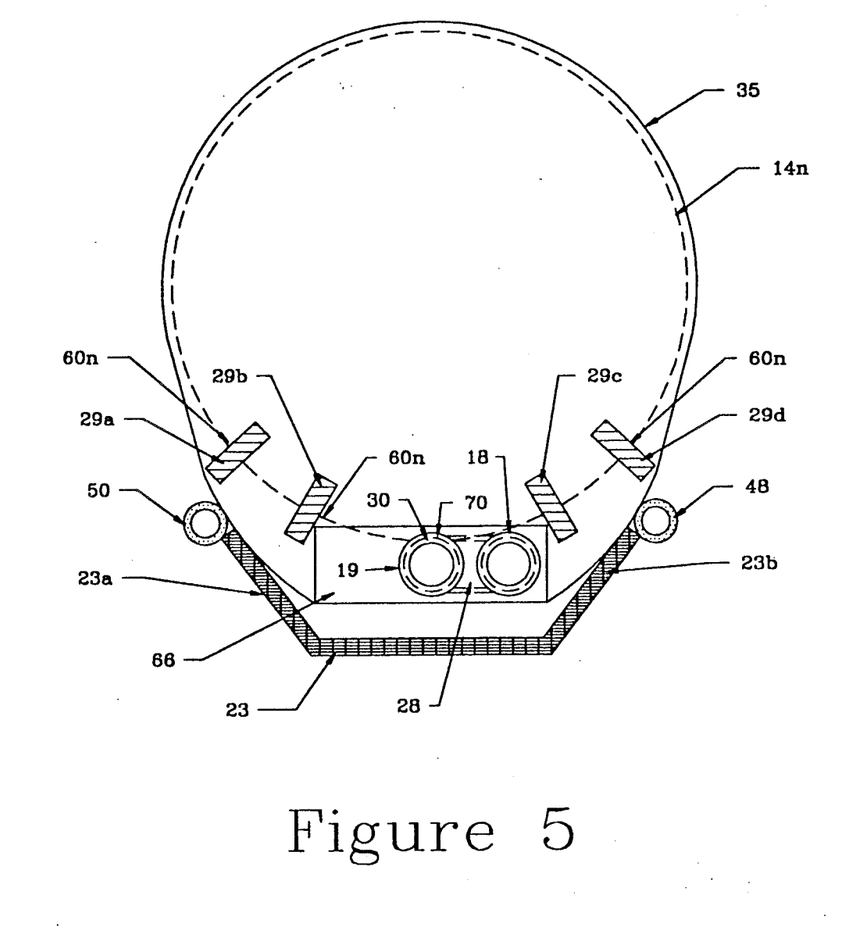
FIG. 5 illustrates a section view of a substrate carrier along line 5—5 of FIG. 4.

FIG. 5 illustrates a section view of the substrate carrier 12a along line 5—5 of FIG. 4 where all numerals correspond to those elements previously described. The substrate carrier 12a is supported by the cantilevered paddle 23. Angled members 23a and 23d of the paddle 23 extend upwardly and outwardly to support the substrate carrier or boat 12a along the tubes 50 and 48. The slotted rails 29a-29d are aligned radially to accommodate the circumference of the gas distribution discs 14a-14n in the wide slot 60n. A notch 70 in the circumference of the gas distribution discs 14a-14n aligns over the secondary gas injection tube 19 at a slotted opening 30 to receive gas as later described.

Figure 6:
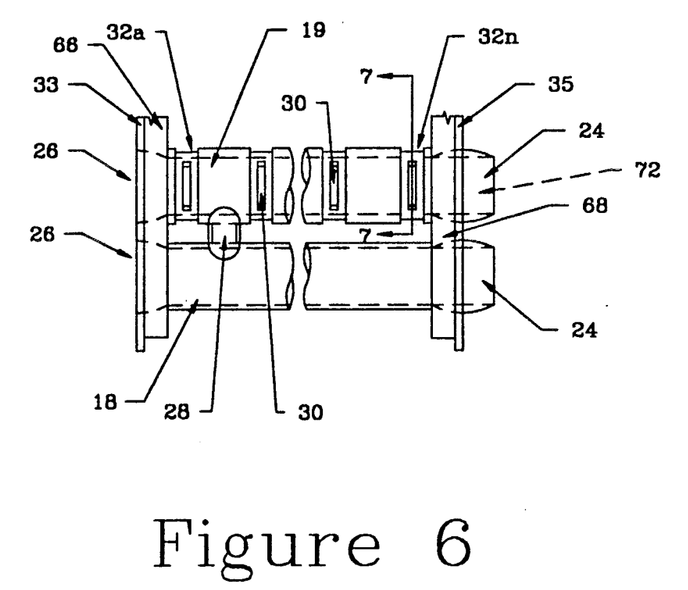
FIG. 6 illustrates a top view of a secondary gas injection tube.

FIG. 6 illustrates a close up top view of the secondary gas injection tube 19 where all numerals correspond to those elements previously described. Illustrated in particular are the slotted openings 30 used to distribute gas from the secondary gas injection tube 19 to the gas distribution discs 14a-14n through a notch 70 on the circumference of each of the gas distribution discs 14a-14n. Each slotted opening 30 plumbs directly to the interior void 72 of the secondary gas injection tube 19.

Figure 7:
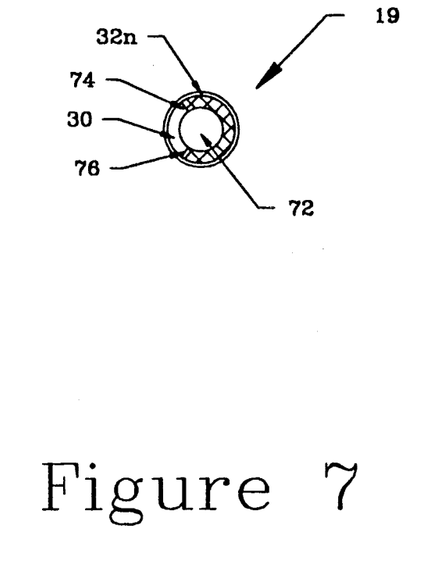
FIG. 7 illustrates a cross section of the secondary gas injection tube along line 7—7 of FIG. 6.

FIG. 7 illustrates a cross section of the secondary gas injection tube 19 along line 7—7 of FIG. 6. The slotted opening 30 is radius cut as evidenced by arced surfaces 74 and 76. The radius of the arced surfaces 74 and 76 correspond to the radius of the gas distribution discs 14a-14n to assure a compatible and desirous coupling between the secondary gas injection tube 19 and each of the gas distribution discs 14a-14n.

Figure 8:
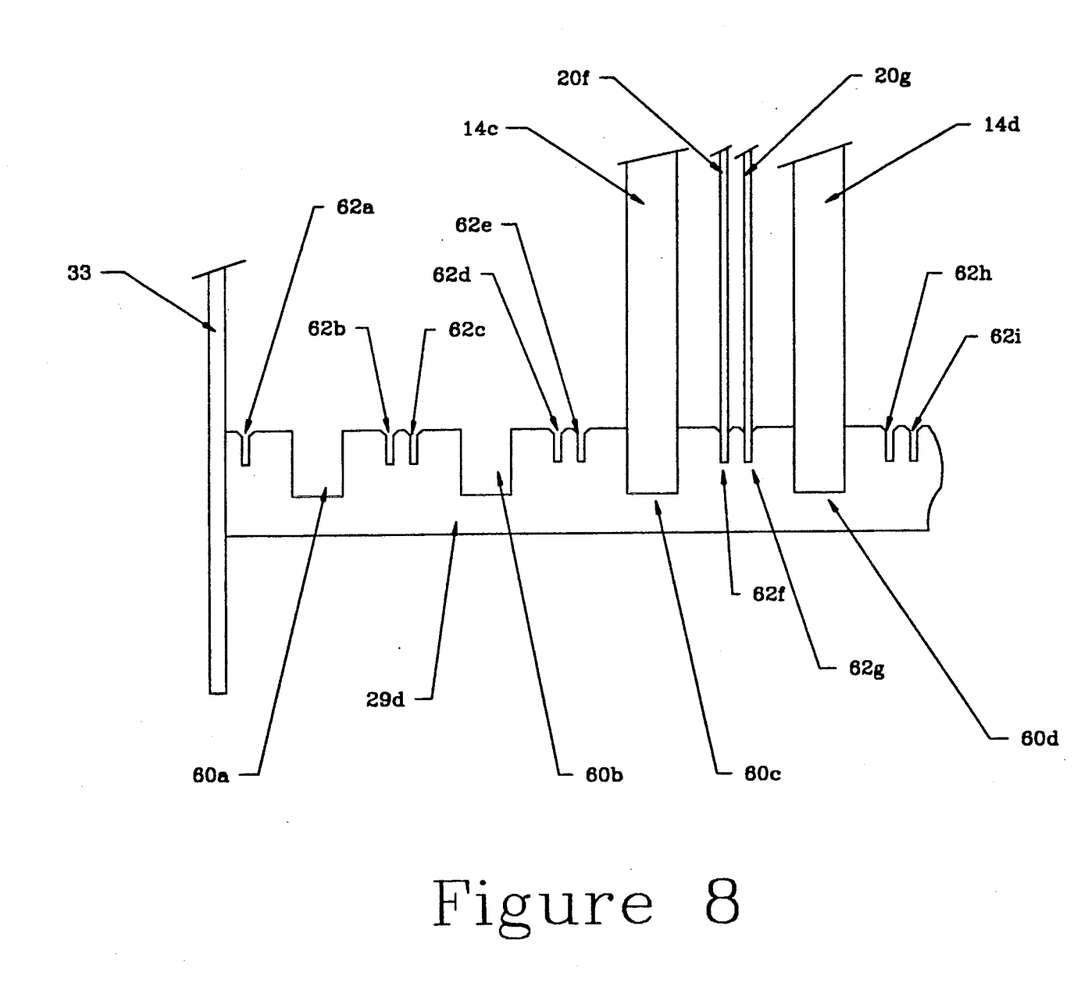
FIG. 8 illustrates a cross section of a rail along line 8—8 of FIG. 4.

FIG. 8 illustrates a cross section of the slotted rail 29d along line 8—8 of FIG. 4. The bottom of the slotted rail 29d has been rotated towards the viewer to obtain a straight forward view. The slotted rail 29d, similar to rails 29a-29c, includes the wide slots 60a-60n alternating with flanking narrow slots, such as 62a and 62b adjacent to the wide slot 60a.

Figures 9, 10:
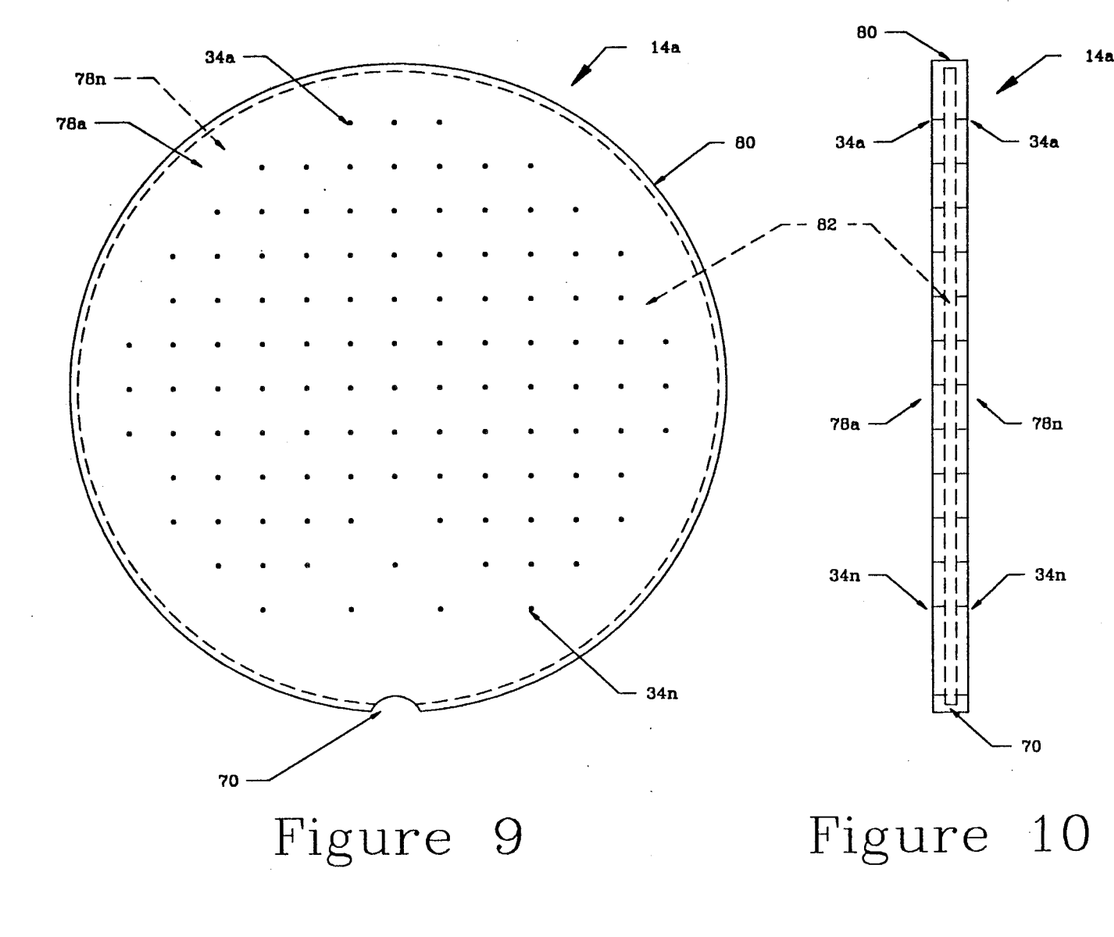
FIG. 9 illustrates a front view of a gas distribution disc.
FIG. 10 illustrates a side view of the gas distribution disc.

FIG. 9 illustrates a front view of a gas distribution disc 14a where all numerals correspond to those elements previously described. The gas distribution discs 14a-14n incorporate opposing planar faces 78a-78n, which are similar in design and proportion. A peripheral wall 80 aligns between the planar faces 78a-78n and at the edge of the planar faces 78a-78n to space the faces and form an internal chamber 82 therebetween. Openings 34a-34n align on each of the planar faces 78a-78n to distribute process gas from the internal chamber 82 onto adjacent substrates.

FIG. 10 illustrates a side view of a gas distribution disc 14a where all numerals correspond to those elements previously described. Illustrated in particular is the interior chamber 82 which distributes processed gas to the openings 34a-34n in the planar faces 78a-78b.

MODE OF OPERATION

Figure 11:
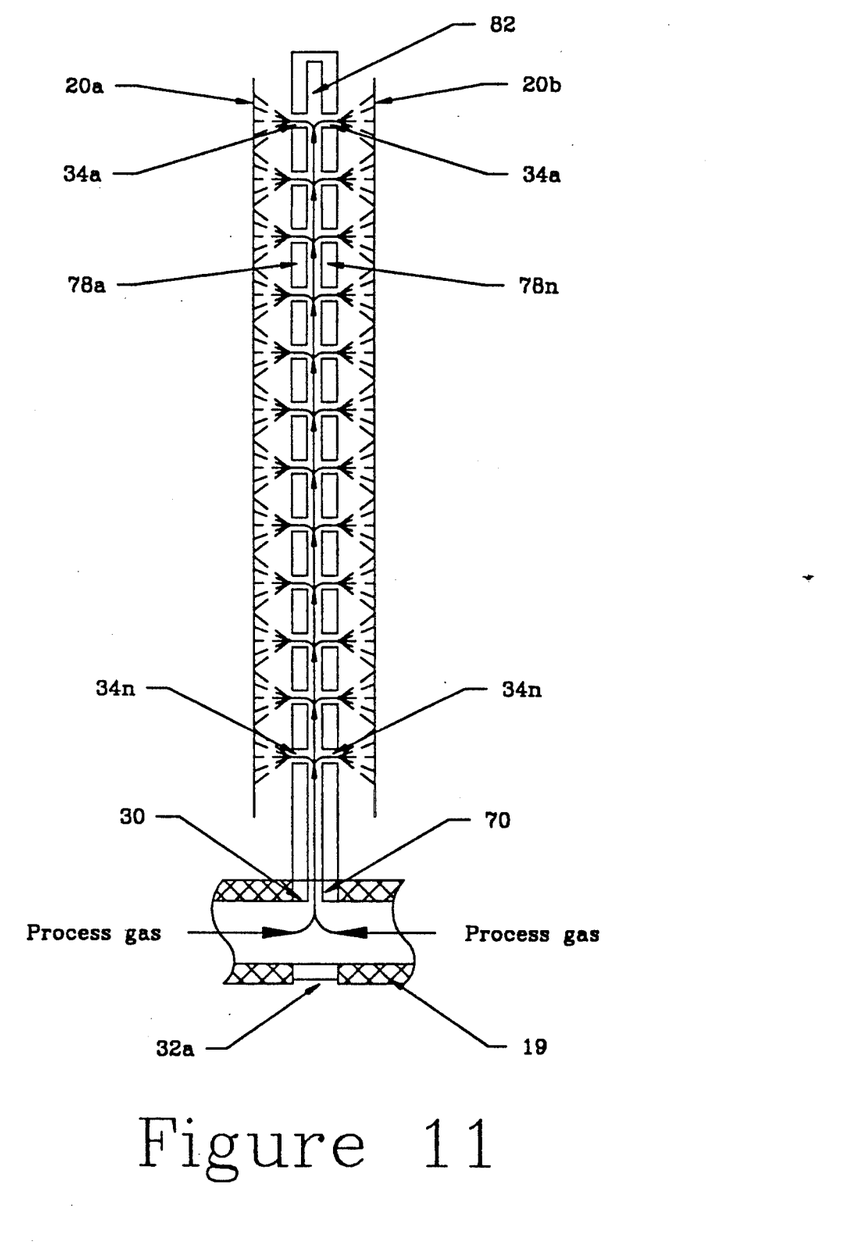
FIG. 11 illustrates the process gas flow through the gas distribution disc.

FIG. 11 illustrates the process gas flow through the gas distribution disc 14a and onto adjacent substrates 20a and 20b. Process gas flows through the secondary gas injection tube 19, the slotted opening 30 in the secondary gas injection tube 19, the notch 70 in the gas distribution disc 14a, the internal chamber 82 and through openings 34a-34n on the opposing planar faces 78a and 78n to impinge upon adjacently placed substrates 20a and 20b.

Substrates are loaded, manually or by some form of automated apparatus, into the slots provided in the substrate carriers. The carriers are loaded onto the furnace loading apparatus (typically a form of cantilever) and mated to one another at their ball joint fittings. The manifold link fixtures are mated at each end of the set of carriers to complete the process gas inject loop, and the process gas source is mated to the fitting on one of the manifold link figures. This requires special gas handling apparatus which delivers gas through an inject along the cantilever assembly.

When the cantilever assembly with the carriers has been loaded into the furnace and the process temperature has stabilized, the process gas is turned on and pressurizes both the primary and secondary injectors. As gas is drained from the secondary injector by the gas distribution discs, it is replaced by the primary injector at several points along its length and at both ends by the manifold link fixtures. In this way, all distribution discs receive identical source pressure of reactant gas. The gas flows into the distribution discs and fills them uniformly. Uniform filling is accomplished by using a minimum internal volume for each disc. For example, when processing 125 millimeter semiconductor wafers, each disc will have an internal volume of less than two cubic centimeters. The gas passes, uniformly, out of openings on both faces of the distribution discs and is uniformly distributed across the surface of the substrates.

Small amounts of unreacted gas are exhausted at the source end of the reaction chamber either by a differential pressure exhaust in the case of atmospheric processes, or by a vacuum pump in the case of low pressure processes.

On completion of the desired amount of film growth, the cantilever with boats and substrates is withdrawn from the furnace tube and the substrates are removed to the next process step.

The process can be used for semiconductor diffusion/oxidation process, semiconductor CVD of doped and undoped LTO, semiconductor CVD of doped and undoped poly- and single-crystalline silicon, semiconductor CVD of silicon nitride, semiconductor CVD of other film types, electronic display panel processing, in vertical or horizontal furnace tubes.

Various modifications can be made to the present invention without departing from the apparent scope hereof.

We claim:

1. Apparatus for producing thin film coatings and/or dopant levels on or in semiconductor wafers or other substrates with improved film growth uniformity (of thickness and composition) and/or dopant uniformity, comprising:
   a. a set of rails slotted for support of substrates to be processed at desired spacings and also slotted;
   b. a primary injection tube having ball joint fittings at each end for mating with other manifold link fixtures and linked by small tubes to a secondary injection tube;
   c. a secondary injection tube having ball joint fittings at each end for mating with other manifold link fixtures and slotted and recessed at intervals; and,
   d. a plurality of gas distribution discs or plates resting on the recesses cut into said secondary injector, facing said substrates, fed by said slots cut into the secondary injector, and including a number of small openings in both faces for the uniform distribution of process gases or vapors to the surfaces of the substrates.

2. The apparatus of claim for semiconductor diffusion/oxidation processes.

3. The apparatus of claim 1 for semiconductor CVD of doped and undoped LTO.

4. The apparatus of claim 1 for semiconductor CVD of doped and undoped Poly.

5. The apparatus of claim for semiconductor CVD of silicon nitride.

6. The apparatus of claim for semiconductor CVD of other film types.

7. The apparatus of claims 1-6 in electronic display panel processing.

8. The apparatus of claims 1-7 in vertical or horizontal furnace tubes.

9. The apparatus of claim 1 made of quartz.

10. Apparatus for producing thin film coatings and/or dopant levels on or in semiconductor wafers or other substrates with improved film growth uniformity (of thickness and composition) and/or dopant uniformity, including a number of boats for carrying said substrates, said apparatus comprising:
    a. a set of rails slotted for support of wafers or substrates to be processed at desired spacings, and also slotted for the support of gas distribution discs between successive sets of back-to-back substrates;
    b. at least one primary injection tube running the length of the boat having ball joint fittings at each end for mating with other boats or manifold link fixtures and linked by small tubes to a secondary injection tube;

c. at least one secondary injection tube running the length of the boat having ball joint fittings at each end for mating with other boats or manifold link fixtures and slotted and recessed at intervals to coincide with the positions of gas distribution discs; and, d. a plurality of gas distribution discs or plates resting on the recesses cut into the secondary injector, facing the substrates, fed by the slots cut into the secondary injector, and having a number of small openings in both faces for the uniform distribution of process gases or vapors to the surfaces of the substrates.

11. The apparatus of claim 10 for semiconductor diffusion/oxidation processes.

12. The apparatus of claim 10 for semiconductor CVD of doped and undoped LTO.

13. The apparatus of claim 10 for semiconductor CVD of doped and undoped Poly.

14. The apparatus of claim 10 for semiconductor CVD of silicon nitride.

15. The apparatus of claim 10 for semiconductor CVD of other film types.

16. The apparatus of claims 11-15 in electronic display panel processing.

17. The apparatus of claims 11-16 in vertical or horizontal furnace tubes.

18. The apparatus of claim 10 made of quartz.

19. The apparatus of claim 10 for LPCVD processes.

20. LPCVD vapor deposition system for producing thin film coatings and/or dopant levels on or in semiconductor wafers or other substrates with improved film growth uniformity (of thickness and composition) and/or dopant uniformity, including a number of boats for carrying said substrates, said boats comprising:

a. a set of rails slotted for support of substrates to be processed at desired spacings, and also slotted for the support of gas distribution discs between successive sets of back-to-back substrates;

b. a primary injection tube running the length of the boat having ball joint fittings at each end for mating with other boats or manifold link fixtures and linked by small tubes to a secondary injection tube;

c. a secondary injection tube running the length of the boat having ball joint fittings at each end for mating with other boats or manifold link fixtures and slotted and recessed at intervals to coincide with the positions of gas distribution discs; and, d. gas distribution discs or plates resting on the recesses cut into the secondary injector, facing the substrates, fed by the slots cut into the secondary injector, and having a number of small openings in both faces for the uniform distribution of process gases or vapors to the surfaces of the substrates.

* * * * *